United States Patent
Chu et al.

(10) Patent No.: US 9,917,212 B1
(45) Date of Patent: Mar. 13, 2018

(54) JFET STRUCTURE AND MANUFACTURING METHOD OF THE SAME

(71) Applicant: TAIWAN SEMICONDUCTOR MANUFACTURING COMPANY LTD., Hsinchu (TW)

(72) Inventors: Fu-Yu Chu, Hsinchu (TW); Chih-Chang Cheng, Hsinchu (TW); Ruey-Hsin Liu, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 15/257,291

(22) Filed: Sep. 6, 2016

(51) Int. Cl.
*H01L 29/808* (2006.01)
*H01L 29/08* (2006.01)
*H01L 29/06* (2006.01)
*H01L 27/146* (2006.01)
*H01L 29/45* (2006.01)
*H01L 29/423* (2006.01)
*H01L 29/66* (2006.01)

(52) U.S. Cl.
CPC ...... *H01L 29/808* (2013.01); *H01L 27/14614* (2013.01); *H01L 27/14643* (2013.01); *H01L 29/0646* (2013.01); *H01L 29/0653* (2013.01); *H01L 29/0847* (2013.01); *H01L 29/423* (2013.01); *H01L 29/45* (2013.01); *H01L 29/66901* (2013.01)

(58) Field of Classification Search
CPC ............ H01L 29/808; H01L 29/1066; H01L 29/66795; H01L 29/785
USPC ........................................ 257/287
See application file for complete search history.

(56) References Cited

U.S. PATENT DOCUMENTS 9,190,536 B1 * 11/2015 Chan ............. H01L 29/1058

* cited by examiner

*Primary Examiner* — Quoc Hoang
(74) *Attorney, Agent, or Firm* — WPAT, P.C., Intellectual Property Attorneys; Anthony King

(57) ABSTRACT

The present disclosure provides a transistor structure, including a self-aligned source-drain structure surrounded by an insulating structure and a gate of a second conductive type separated from the source and the drain by the insulating structure. The self-aligned source-drain structure includes a source and a drain of a first conductive type, a channel between the source and the drain, and a polysilicon contact over and aligned with the channel. A method for manufacturing the transistor structure is also provided in the present disclosure.

20 Claims, 12 Drawing Sheets

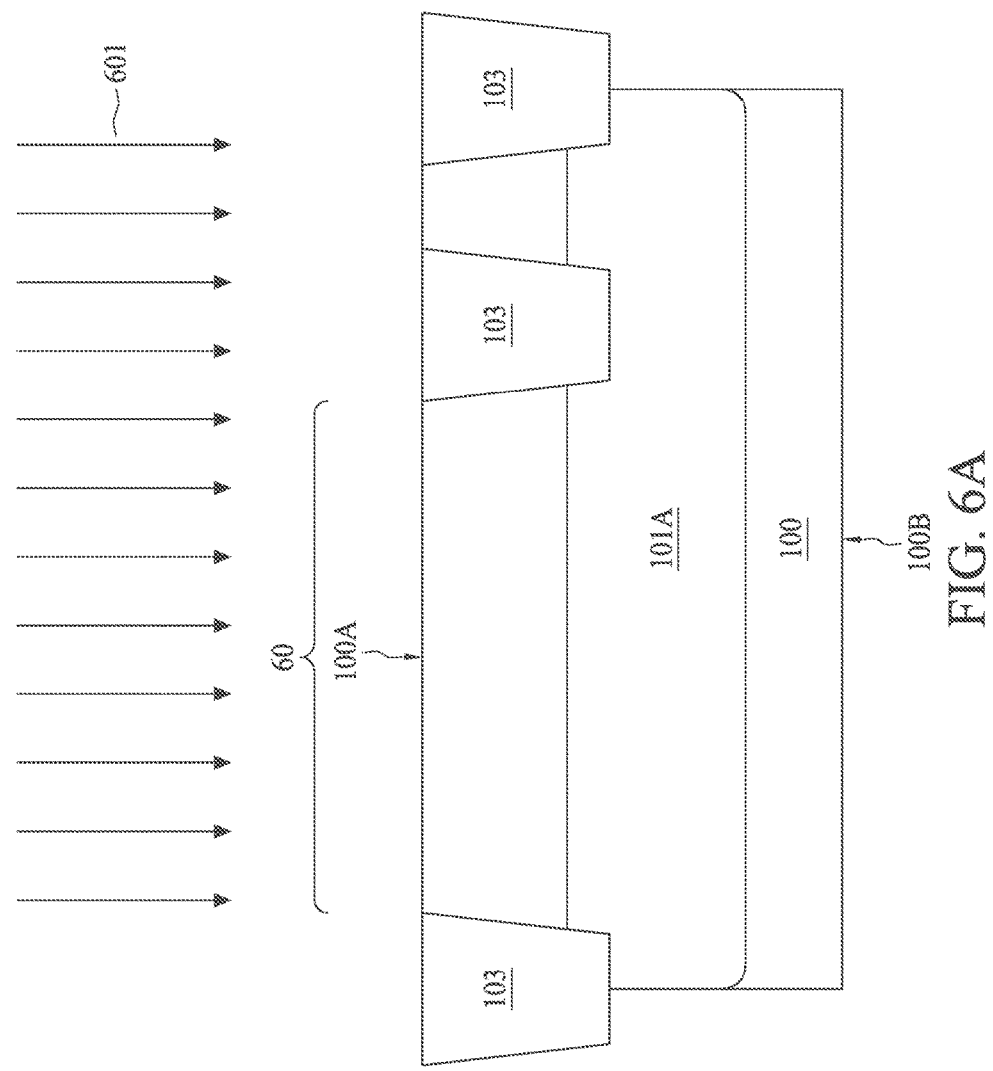

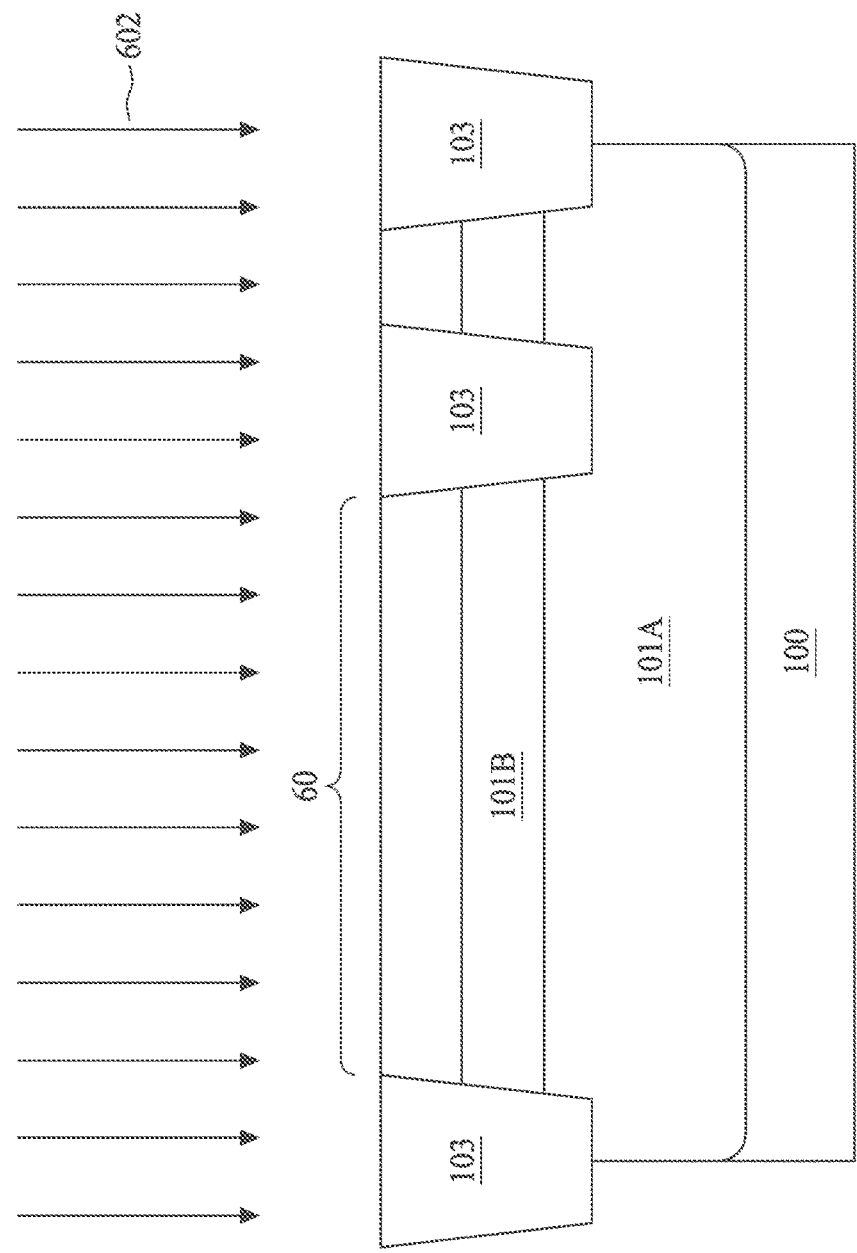

JFET STRUCTURE AND MANUFACTURING METHOD OF THE SAME

BACKGROUND

Integrated circuits meant to perform logic functions are generally made in CMOS technology. To perform analog functions, bipolar components are generally preferred to be used. However, the simultaneous forming of CMOS and bipolar components on the same chip requires the use of so-called BICMOS lines which are more expensive than CMOS lines. Thus, in many cases, MOS transistors, for example, are used as input/output transistors to perform the analog functions. However, in low frequency applications, these transistors have the disadvantage of exhibiting a high output noise level due to carrier recombinations at the interface between silicon and silicon oxide. To compensate this problem, which is intrinsic since it is linked to the very surface operating principle of MOS transistors, MOS transistors of large dimensions which have the disadvantage of consuming a large amount of silicon are used.

Junction field-effect transistors (JFET) are known to have, with respect to insulated gate field effect transistors (MOSFET, or merely MOS), the advantage of a lower noise, fast switching speed, high power handling capability, etc. These characteristics make JFETs a design consideration in various power applications, such as power amplifiers.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 6A to FIG. 6F show cross sectional views of a sequence of a method for manufacturing a transistor structure, in accordance with some embodiments of the present disclosure.

DETAILED DESCRIPTION

Figure 1:
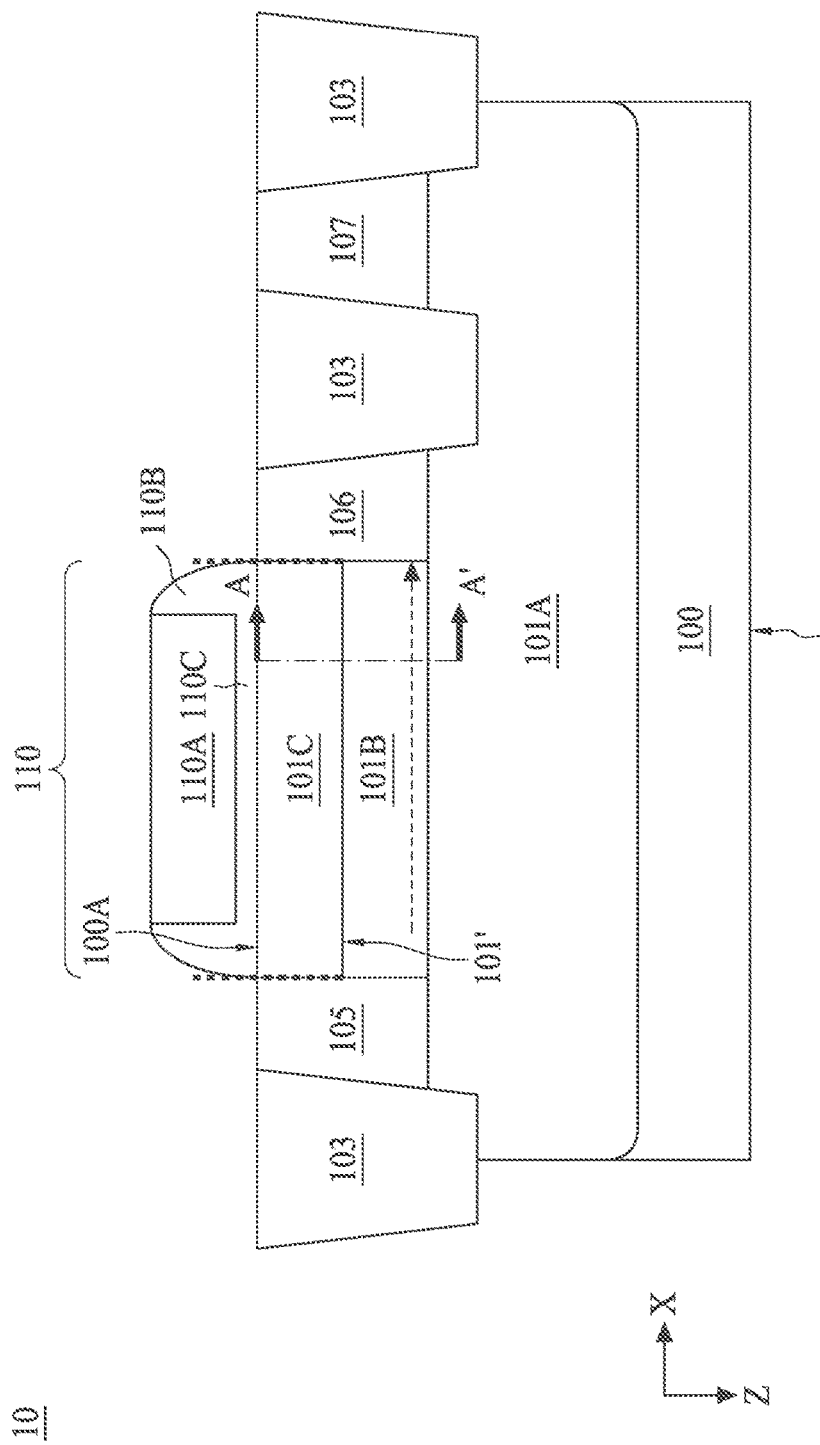
FIG. 1 is a cross sectional view of a p-type transistor structure, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

Device scale shrinking of a conventional Junction field-effect transistors (JFET) is hampered by its device geometry and photolithography manufacturing operations. For example, a p-JFET utilizes a p-well implantation to form device channel and an n-well implantation to form a gate junction in contact with the aforesaid device channel. At least two masks are required for the opposite polarity well implantation as previously described, and the geometry of the conventional JFET rendering a greater device area as opposed to the geometry of a complementary metal-oxide-silicon (CMOS).

The present disclosure provides a scale-shrinking JFET transistor but also retaining sufficient distance between the channel and the silicon/silicon oxide surface. The proposed JFET is about one fourth the length of the conventional JFET. The method of manufacturing the JFET described herein utilizes the self-align source-drain technique of the CMOS transistor to form a self-align source-drain structure surrounded by an insulating structure, for example, a shallow trench isolation (STI). A gate is further formed outside the area surrounded by the STI.

Due to stringent constraint for source follower in a 4T Active Passive Sensing circuit, conventional greater scale JFET cannot be implemented in CIS for flicker noise improvement. The scale-shrinking JFET transistor described herein can be exploited in a CMOS image sensor (CIS) requiring a low flicker noise, for example. In some embodiments, the flicker noise of the JFET image sensor is lower than that of a conventional CMOS image sensor by 1 order of magnitude. However, the scale-shrinking JFET transistor described herein is not limited to image sensor application, other normally-on devices requiring low flicker noise may implement the scale-shrinking JFET transistor provided in the present disclosure.

Referring to FIG. 1, FIG. 1 is a cross sectional view of a p-type transistor structure, in accordance with some embodiments of the present disclosure. In some embodiments, the p-type transistor structure is a PJFET 10. The PJFET 10 comprises a substrate 100, an insulating structure (STI) 103 formed in the substrate 100, and a series of PJFET wells, including a deep n-well 101A, a p-well 101B, an n-well 101C. The deep n-well 101A, the p-well 101B, the n-well 101C, and the insulating structure 103 extend from a front surface 100A downwardly to the back surface 100B of the substrate 100. The PJFET 10 further comprises a source region 105, a drain region 106, and a gate region 107, all of which are formed in the substrate 100. In the present embodiment, the source region 105 and the drain region 106 are heavily p-doped, and the gate region 107 is heavily n-doped. The gate region 107 is separated from the source and the drain region by the insulating structure 103. Furthermore, similar to the source region 105 and the drain region 106, the gate region 107 exposes its top surface at the front surface 100A of the substrate 100, and extend its bottom surface toward the back surface 100B of the substrate 100 at a depth level substantially the same as the level of the bottom surface of the source region 105 and the drain region 106.

The n-well 101C is a weakly doped region with n-type dopants, compared to that of the gate region 107. For example, in some embodiments, the n-well 101C has a dopant concentration of from about $1E16/cm^3$ to about $1E18/cm^3$, and the gate region 107 has a dopant concentration of from about $1E18/cm^3$ to about $1E20/cm^3$. In some embodiments, the dopant concentration of the p-well 101B and the n-well 101C are substantially identical but with opposite dopant polarities. In some embodiments, the bottom of the deep n-well 101A serves as an isolation layer having a dopant concentration of about $1E16/cm^3$ to about $1E19/cm^3$ so as to isolate individual devices on the same substrate 100. The n-well 101C extends from the front surface 100A of the substrate 100 downwardly in the thickness direction Z to contact the p-well 101B. In some embodiments, the n-well 101C can be picked up in Y direction and said n-doped region being connected to the gate region 107 by proper layout skills. For example, the n-well 101C can be picked up by an n-doped region (not shown in FIG. 1) in Y direction abutting the n-well 101C and said n-doped region being connected to the deep n-well 101A as well as the gate region 107. In some embodiments, when viewing the PJFET 10 from a top perspective, the aforesaid n-doped region (not shown in FIG. 1) in Y direction and the source/drain region 105/106 are enclosed by a the insulating structure 103. The deep n-well 101A is formed below the p-well 101B. In one or more embodiments, the deep n-well 101A contacts the bottom of the p-well 101B. The deep n-well 101A and n-well 101C together define the p-well 101B, which forms a channel region of the PJFET when reverse bias applied to the gate region 107, or in some embodiment, applied to both the gate region 107 and the polysilicon contact 110. In some embodiments, bias to n-well 101C can be picked up by the polysilicon contact 110, the n-doped region (not shown in FIG. 1) in Y direction abutting the n-well 101C, or both.

The channel region is a p-channel having at least one p-type dopant doped therein. The channel region contacts a bottom surface of the n-well 101C and a top surface of the deep n-well 101A. The channel region electrically connects the source region 105 and the drain region 106. In some embodiments, as depicted in FIG. 1, a horizontal interface 101' of the n-well 101C and the p-well 101B is substantially at a level of one half toward the Z direction of the source region 105 or the drain region 106. Alternatively stated, the channel region, when the PJFET 10 is normally on, has a thickness of about half of the depth of the source region 105 or the drain region 106.

A polysilicon contact 110 is disposed over the front surface 100A of the substrate 100, as depicted in FIG. 1. In some embodiments, the polysilicon contact 110 includes bulk polysilicon 110A, sidewall spacer 110B, and dielectric layer 110C. The bulk polysilicon 110A is on the dielectric layer 110C. The bulk polysilicon 110A may include a conductive material such as doped polysilicon. Alternatively, the bulk polysilicon 110A can be replaced by other conductive materials such as a metal, a metal alloy, or the like. A silicide layer (not shown) may be formed on the bulk polysilicon 110A by a self-aligned silicide process. The dielectric layer 110C is on the front surface 100A of the substrate 100 and between the drain region 105 and the source region 106. The dielectric layer 110C may include silicon oxide, silicon nitride, silicon oxynitride, a high-k dielectric material, combinations thereof, or multi-layers thereof. The high-k dielectric material may comprise $TiO2$, $HfZrO$, $Ta2O3$, $HfSiO4$, $ZrO2$, $ZrSiO2$, combinations thereof, or other suitable material. The dielectric layer 110C may have a thickness between about 20 Å and about 1000 Å, although different thicknesses may be used. The sidewall spacer 110B is at both sides of the bulk polysilicon 110A. The spacer 110B can be made of a dielectric material, such as silicon oxide, silicon oxynitride (SiON), or silicon nitride (SiN).

In some embodiments, a width of the polysilicon contact 110, for example, from one side to the opposite side of the sidewall spacer 110B, is aligned with a separation region between the source region 105 and the drain region 106 because the source region 105 and the drain region 106 are formed by a self-aligned technique utilizing the polysilicon contact 110 as a hardmask. The polysilicon contact 110 can be electrically connected to the gate region 107, the source or the drain region, or floating. In some embodiments, the polysilicon contact 110 is electrically connected to the gate region 107 in order to form comparable depletion regions at the top surface and the bottom surface of the p-well 101B. In other embodiments, the polysilicon contact 110 is floating and subjected to external bias such that the threshold voltage $V_t$ or the pinch-off voltage can be independently controlled.

During a period in which there is no voltage applied to the gate region 107, the PJFET 10 is in a fully conductive state with the channel region electrically connecting the source region 105 and the drain region 106. When the PJFET 10 is in the conductive state, electric current is permitted to flow along a current path as indicated by the arrows in FIG. 1. Specifically, the current flows from the source region 105 horizontally in the direction X to the channel region, then flows in the direction X to the drain region 106. During a period in which a reverse bias voltage, i.e., a positive voltage, is applied to the gate region 107, depletion regions (not shown) are developed in the n-well 101C above the channel region and the deep n-well 101A below the channel region. The depletion regions extend from the corresponding interfaces toward each other in the direction Z, and reduce the width of the current path and limit a level of the current flowing through the PJFET 10. As a level of the reverse bias voltage increases, the depletion regions increasingly extend toward each other and further reduce the width of the current path. At a sufficient level of the reverse bias voltage, i.e., a pinch-off voltage, the current path is pinched off and the PJFET 10 is switched off.

Figure 2:
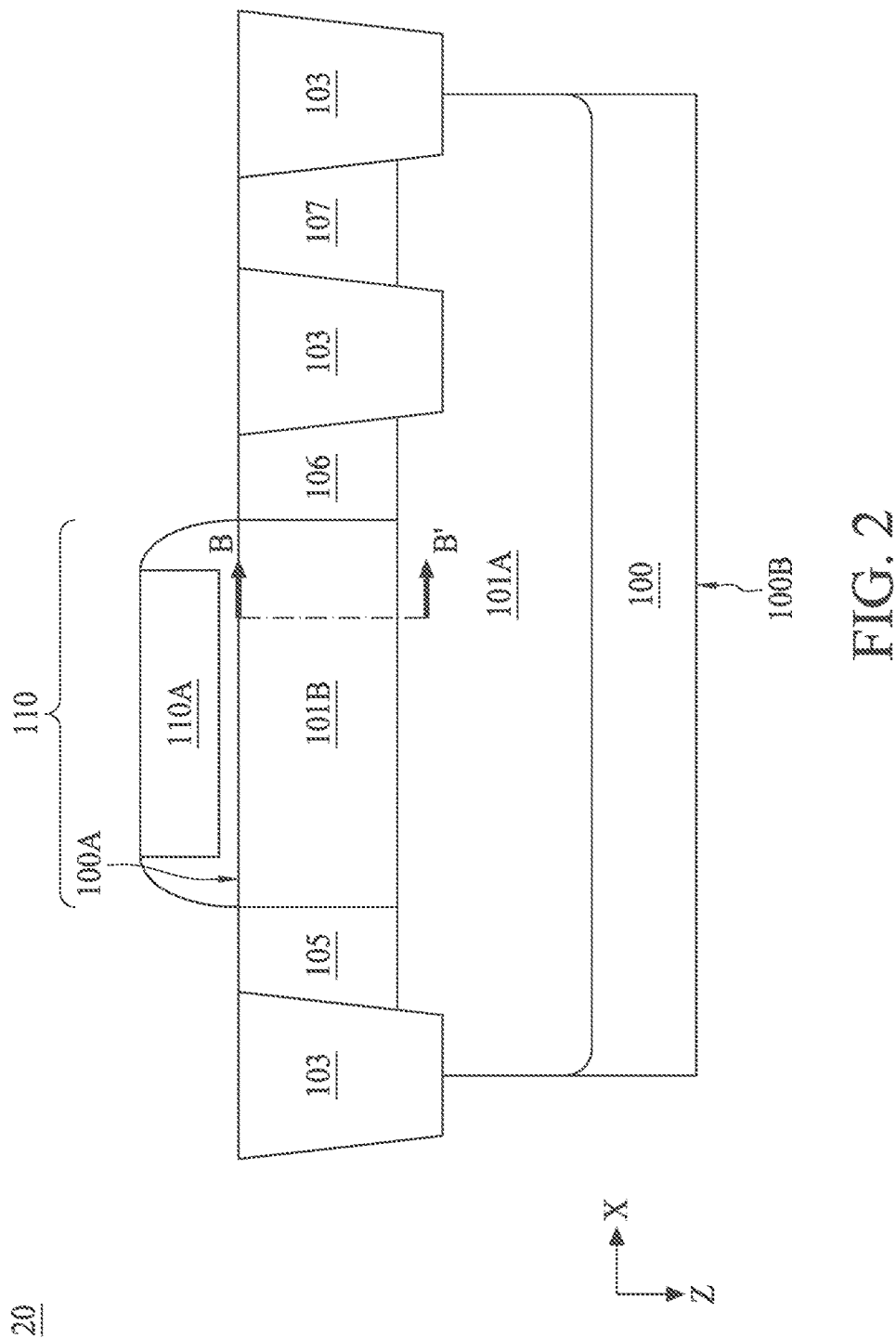
FIG. 2 is a cross sectional view of a p-type transistor structure, in accordance with some embodiments of the present disclosure.

Referring to FIG. 2, FIG. 2 is a cross sectional view of a p-type transistor structure, in accordance with some embodiments of the present disclosure. In some embodiments, the p-type transistor structure is a PJFET 20. The PJFET 20 and the PJFET 10 in FIG. 1 are similar except for that only a deep n-well 101A and a p-well 101B are presented as PJFET wells in the device. The polysilicon contact 110 is thus in contact with the p-well 101B at the front surface 100A of the substrate 100. A channel region of the PJFET 20 is defined by the source region 105, the drain region 106, the polysilicon contact 110, and the deep n-well 101A. PJFET 10 and PJFET 20 demonstrate different channel behaviors that suit different device needs. The different channel behaviors are shown in the diagram of FIG. 3 and FIG. 4, as discussed in the following.

Figure 3:
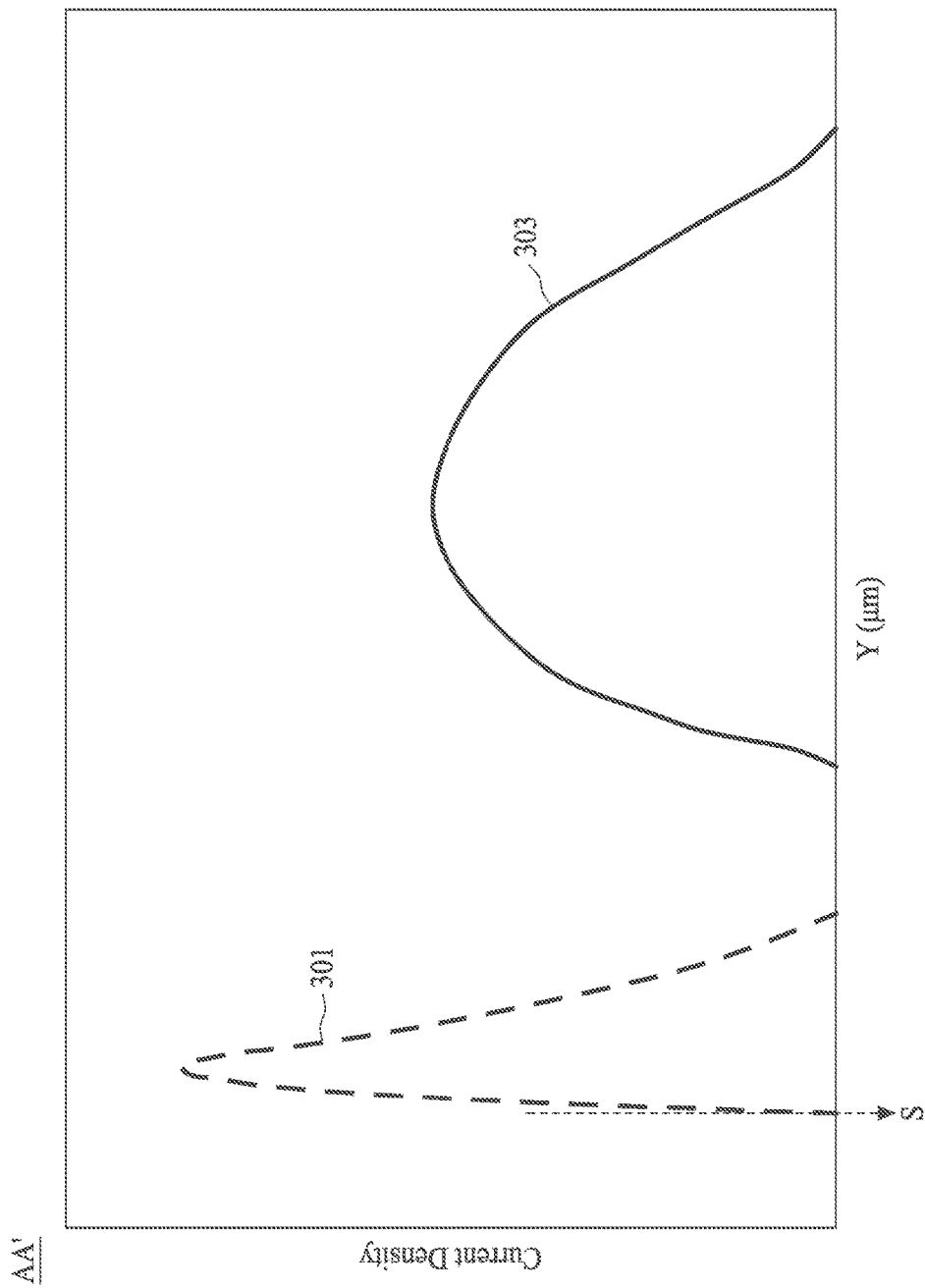
FIG. 3 is a diagram showing current density with respect to the depth of the p-type transistor structure as shown in FIG. 1.

FIG. 3 is a diagram showing current density with respect to the depth of the PJFET 10 as shown in FIG. 1. The current distribution along line AA' of FIG. 1 is shown by current density as a function of depth measured from the front surface S. Traditional CMOS current distribution 301 is illustrated by dotted lines. Traditional CMOS current peaks at a range of from about 100 to 300 Angstrom under the front surface S of a silicon substrate. However, as shown by the current distribution 303 of the PJFET 10, the current peaks at more than 500 Angstrom under the front surface S of a silicon substrate and is spread without coupling to the traditional CMOS current peak, thereby generating a lower flicker noise. The n-well 101C of PJFET 10 effectively prevent the current path from spreading to the top surface S and thus the current distribution shows a narrower spread compared to the PJFET 20 counterpart, as discussed below. The peak of current distribution can be designed by controlling the concentration profile along the depth of the PJFET. When a lower noise is required, the peak concentration of the p-dopant is implanted to situate in proximity to the bottom of the p-well 101B. When a higher driving current density is required, the peak concentration of the p-dopant is implanted to situate in proximity to the top of the p-well 101B. In some embodiments, different dopant materials are utilized in the p-well 101B for optimizing desired dopant concentration profile. For example, boron is used to form a broader profile and with a large junction depth by various implant powers, followed by an indium implantation which forms a narrower profile overlapping the bottom of the broader boron profile. The PJFET 10 is suitable for devices requiring extremely low noise and moderate driving current density.

Figure 4:
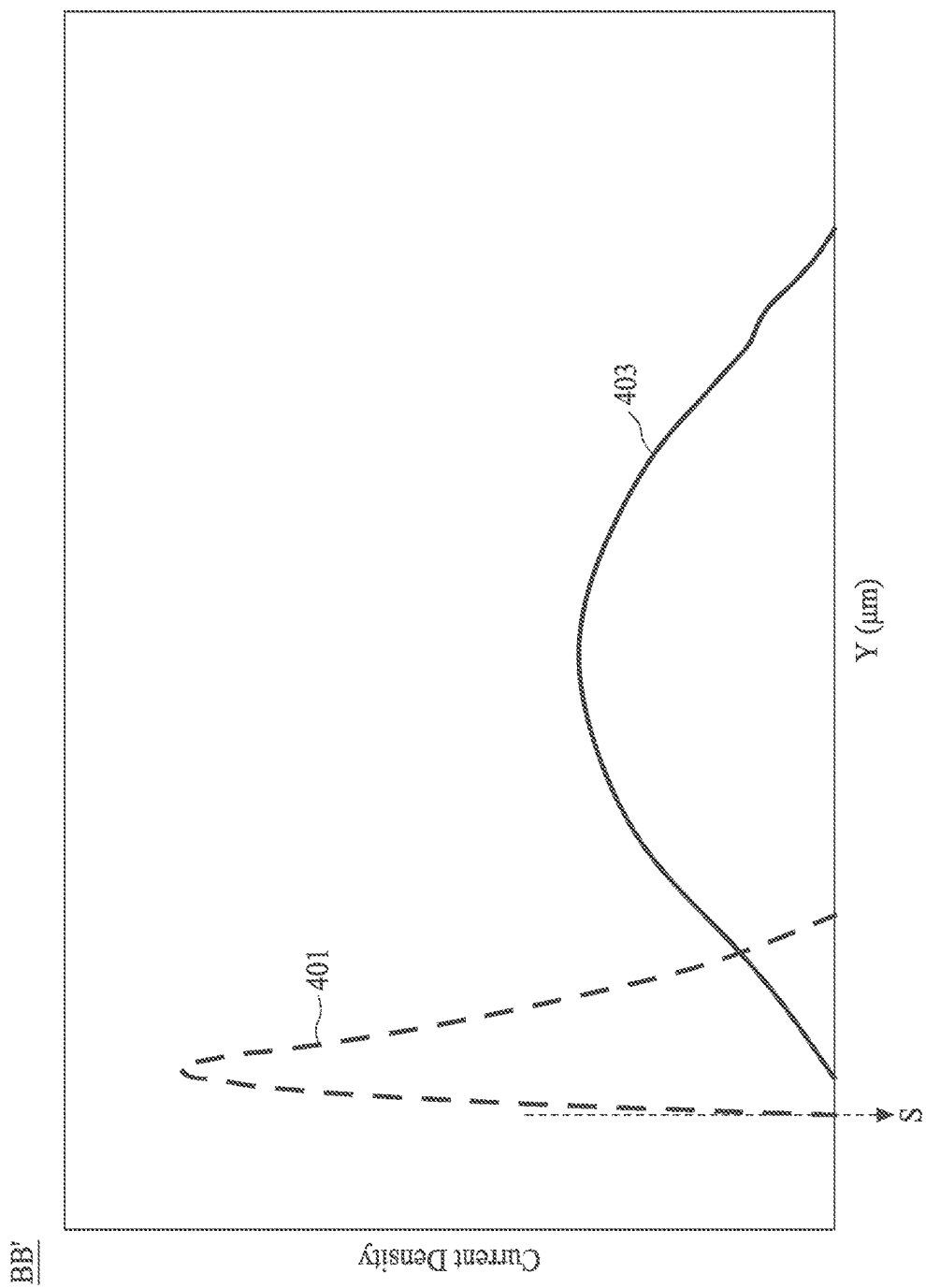
FIG. 4 is a diagram showing current density with respect to the depth of the p-type transistor structure as shown in FIG. 2.

FIG. 4 is a diagram showing current density with respect to the depth of the PJFET 20 as shown in FIG. 2. The current distribution along line BB' of FIG. 2 is shown by current density as a function of depth measured from the front surface S. Traditional CMOS current distribution 401 is illustrated by dotted lines. Traditional CMOS current peaks at a range of from about 100 to 300 Angstrom under the front surface S of a silicon substrate. However, as shown by the current distribution 403 of the PJFET 20, the current peaks at more than 500 Angstrom under the front surface S of a silicon substrate and is coupling to the traditional CMOS current distribution 401, thereby generating a moderate flicker noise but with high driving current density. The p-well 101B of PJFET 20 effectively broaden the current path by spreading the current toward the top surface S and thus the current distribution shows a wider spread compared to the PJFET 10 counterpart, as previously discussed. The PJFET 20 is suitable for devices requiring moderate low noise and high driving current density.

Figure 5:
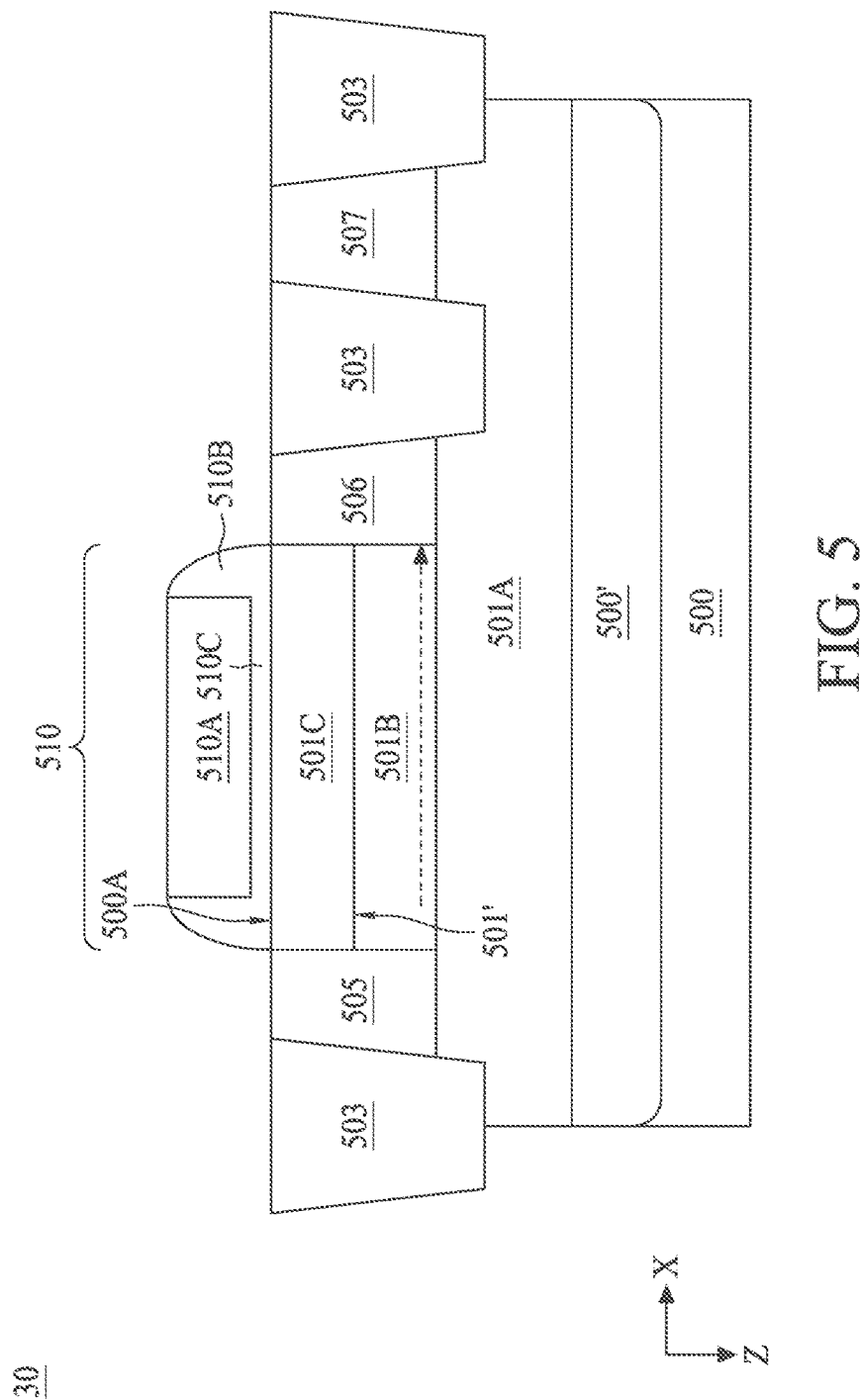
FIG. 5 is a cross sectional view of an n-type transistor structure, in accordance with some embodiments of the present disclosure.

FIG. 5 is a cross sectional view of an n-type transistor structure, in accordance with some embodiments of the present disclosure. In some embodiments, the n-type transistor structure is an NJFET 30. The NJFET 30 comprises a substrate 500, an insulating structure (STI) 503 formed in the substrate 500, and a series of NJFET wells, including an isolation layer 500', a deep p-well 501A, an n-well 501B, and a p-well 501C. The deep p-well 501A, the n-well 501B, the p-well 501C, and the insulating structure 503 extend from a front surface 500A downwardly to the back surface 500B of the substrate 500. The p-well 501C is in contact with a polysilicon contact 510, as would be discussed in the following. The NJFET 30 further comprises a source region 505, a drain region 506, and a gate region 507, all of which are formed in the substrate 500. In the present embodiment, the source region 505 and the drain region 506 are heavily n-doped, and the gate region 507 is heavily p-doped. The gate region 507 is separated from the source and the drain region by the insulating structure 503. Furthermore, similar to the source region 505 and the drain region 506, the gate region 507 exposes its top surface at the front surface 500A of the substrate 500, and extends its bottom surface toward the back surface 500B of the substrate 500 at a depth level substantially the same as the level of the bottom surface of the source region 505 and the drain region 506.

The p-well 501C and n-well 501B are weakly doped regions with p-type and n-type dopants, respectively, compared to that of the gate region 507. For example, in some embodiments, the p-well 501C has a dopant concentration of from about $1E16/cm^3$ to about $1E18/cm^3$, and the gate region 107 has a dopant concentration of from about $1E18/cm^3$ to about $1E20/cm^3$. In some embodiments, the dopant concentration of the p-well 501C and n-well 501B are substantially identical but with opposite dopant polarities. In some embodiments, the deep p-well 501A has a dopant concentration of about $1E16/cm^3$ to about $1E18/cm^3$, and the isolation layer 500' has a dopant concentration of about $1E18/cm^3$ or greater so as to isolate individual devices on the same substrate 500. The p-well 501C extends from the front surface 500A of the substrate 500 downwardly in the thickness direction Z to contact the n-well 501B. In some embodiments, the p-well 501C can be picked up in Y direction and said p-doped region being connected to the gate region 507 by proper layout skills. For example, the p-well 501C can be picked up by a p-doped region (not shown in FIG. 5) in Y direction abutting the p-well 501C and said p-doped region being connected to the deep p-well 501A as well as the gate region 507. In some embodiments, when viewing the NJFET 30 from a top perspective, the aforesaid p-doped region (not shown in FIG. 5) in Y direction and the source/drain region 505/506 are enclosed by a the insulating structure 503. The deep p-well 501A is formed below the n-well 501B. In one or more embodiments, the deep p-well 501A contacts the bottom of the n-well 501B. The deep p-well 501A and p-well 501C together define the n-well 501B, which forms a channel region of the NJFET when reverse bias applied to the gate region 507, or in some embodiment, applied to both the gate region 507 and the polysilicon contact 510. In some embodiments, bias to p-well 501C can be picked up by the polysilicon contact 510, the p-doped region (not shown in FIG. 5) in Y direction abutting the p-well 501C, or both.

The channel region is an n-channel having at least one n-type dopant doped therein. The channel region contacts a bottom surface of the p-well 501C and a top surface of the deep p-well 501A. The channel region electrically connects the source region 505 and the drain region 506 and the current peaks at about 500 Angstrom under the front surface 500A of the substrate 500, approximately located within the n-well 501B. In some embodiments, as depicted in FIG. 5, a horizontal interface 501' of the p-well 501C and the n-well 501B is substantially at a level of one half toward the Z direction of the source region 505 or the drain region 506. Alternatively stated, the channel region, when the NJFET 30 is normally on, has a thickness of about half of the depth of the source region 505 or the drain region 506.

A polysilicon contact 510 is disposed over the front surface 500A of the substrate 500, as depicted in FIG. 5. In some embodiments, the polysilicon contact 510 includes bulk polysilicon 510A, sidewall spacer 510B, and dielectric layer 510C. In some embodiments, a width of the polysilicon contact 510, for example, from one side to the opposite side of the sidewall spacer 510B, is aligned with a separation region between the source region 505 and the drain region 506 because the source region 505 and the drain region 506 are formed by a self-aligned technique utilizing the polysilicon contact 510 as a hardmask. The polysilicon contact 510 can be electrically connected to the gate region 507, the source or the drain region, or floating. In some embodiments, the polysilicon contact 510 is electrically connected to the gate region 507 in order to form comparable depletion regions at the top surface and the bottom surface of the p-well 501B. In other embodiments, the polysilicon contact 510 is floating and subjected to external bias such that the threshold voltage $V_t$ or the pinch-off voltage can be independently controlled.

One or more effects described with respect to the PJFETs 10 and 20 are also obtainable in the NJFET 30 in accordance with some embodiments. During a period in which there is no voltage applied to the gate region 507, the NJFET 30 is in a fully conductive state with the channel region electrically connecting the source region 105 and the drain region 506. When the NJFET 30 is in the conductive state, electric current is permitted to flow along a current path as indicated by the arrows in FIG. 5. Specifically, the current flows from the source region 505 horizontally in the direction X to the channel region, then flows in the direction X to the drain region 506. During a period in which a reverse bias voltage, i.e., a negative voltage, is applied to the gate region 507, depletion regions (not shown) are developed in the p-well 501C above the channel region and the deep p-well 501A below the channel region. The depletion regions extend from the corresponding interfaces toward each other in the direction Z, and reduce the width of the current path and limit a level of the current flowing through the NJFET 30. As a level of the reverse bias voltage increases, the depletion regions increasingly extend toward each other and further reduce the width of the current path. At a sufficient level of the reverse bias voltage, i.e., a pinch-off voltage, the current path is pinched off and the NJFET 30 is switched off.

Figure 6C:
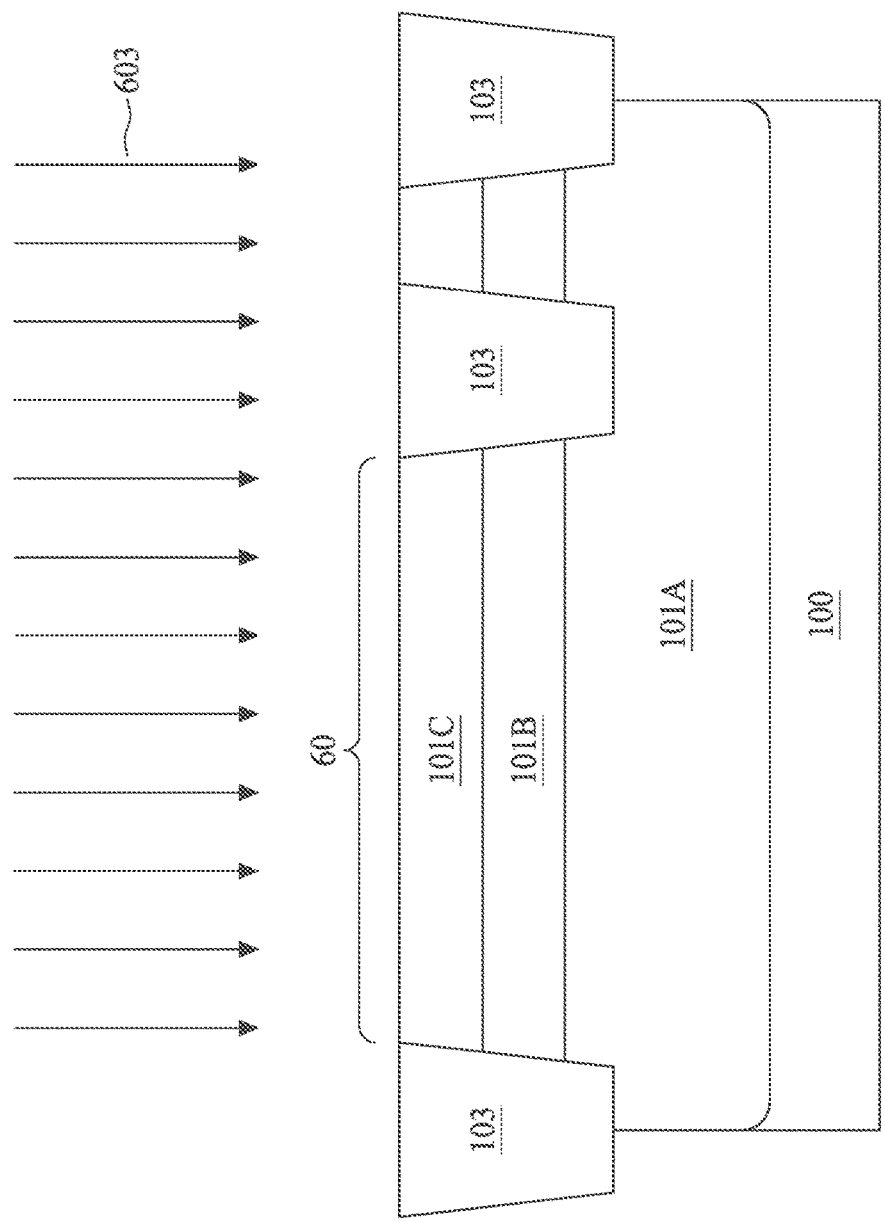

Referring to FIG. 6A to FIG. 6F, FIG. 6A to FIG. 6F show cross sectional views of a sequence of a method for manufacturing a PJFET, in accordance with some embodiments of the present disclosure. In FIG. 6A, one or more insulating structure (STI) 103 are subsequently formed in a p-substrate 100. In at least one embodiment, the insulating structure (STI) 103 extends around a self-aligned structure 60 of the PJFET where a source region, a drain region, and a polysilicon contact of the PJFET are to be formed.

In some embodiments, the insulating structure (STI) 103 is formed in the substrate 100 before PJFET well formation by opening trenches (not shown) from the top surface 100A of the substrate 100, then filling the trenches with an isolation material, such as silicon oxide. The trenches are formed by in at least one embodiment by lithographic and/or etching processes. The depth and/or width of the insulating structure (STI) 103 are selected according to the design and/or intended electrical characteristics of the PJFET to be manufactured.

Subsequently, the deep n-well 101A is formed in the substrate 100 by depositing a photoresist (not shown) over the substrate 100 and patterning the deposited photoresist to form a mask having a pattern of the deep n-well 101A. The mask is used in an ion implantation 601 performed to implant an n-type dopant into the substrate 100 to form the deep n-well 101A. In at least one embodiment, the ion implantation is controlled by one or more of energy, dose, and implantation angle to implant the n-type dopant sufficiently deep into the substrate 100. As shown in FIG. 6A, a bottom of the deep n-well 101A is so controlled to be lower than a bottom of the insulating structure (STI) 103, and a top of the deep n-well 101A is so controlled to be away from the front surface 100A of the substrate 100. In some embodiments, the dopant concentration of the deep n-well 101A is about $1E16/cm^3$ to about $1E19/cm^3$. The mask is subsequently removed. In FIG. 6B, a p-well 101B is formed in the substrate 100 by using the same photoresist (not shown) as that used in the formation of the deep n-well 101A. As previously discussed in FIG. 1, the p-well forms a channel region of the PJFET when applying external bias to the gate. The ion implantation 602 for forming the p-well 101B is controlled by one or more of energy, dose, and implantation angle. In at least one embodiment, the doping concentration or doping dose for forming the p-well 101B is lower than that for forming the deep n-well 101A. In some embodiments, the dopant concentration of the p-well 101B is in a range from about $1E16/cm^3$ to about $1E18/cm^3$.

In FIG. 6C, an n-well 101C is formed in the self-aligned structure 60 of the PJFET utilizing the same technique previously addressing the formation of the p-well 101B. The n-well 101C has an upper part co-elevational with the front surface 100A of the substrate 100. The bottom of the n-well 101C contacts the p-well 101B. The n-well 101C extends sideways to contact with one or both of the insulating structure 103. The ion implantation 603 is controlled by one or more of energy, dose, and implantation angle to implant the n-type dopant sufficiently shallow into the substrate 100. As can be seen from FIG. 6C, a bottom of the n-well 101C is so controlled to be situated from about 300 Angstrom to about 500 Angstrom below the front surface 100A of the substrate 100, and is surrounded by the insulating structure 103.

Figure 6D:
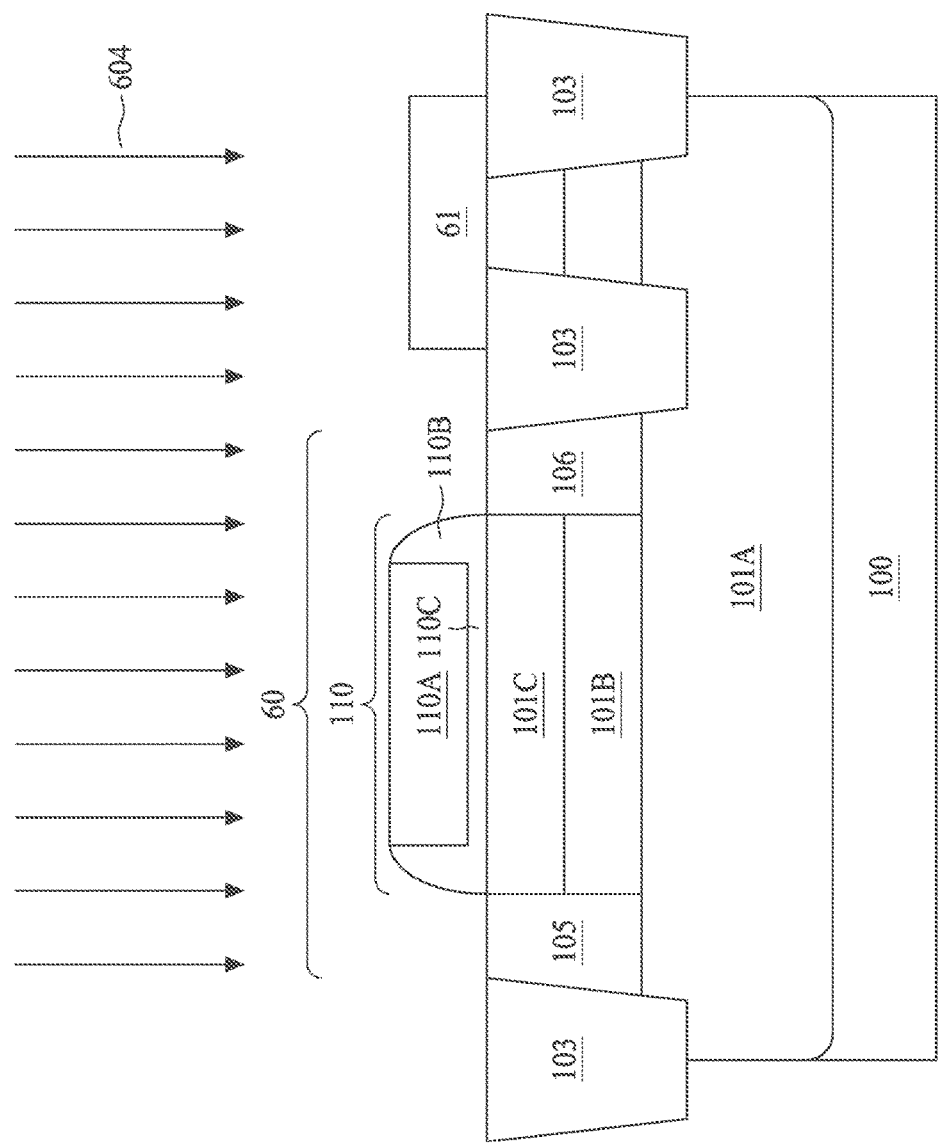

In FIG. 6D, a source 105 and a drain 106 region is formed in the self-aligned structure 60 of the PJFET by using polysilicon contact 110 as a hard mask. The formation of the polysilicon contact 110 includes forming a dielectric layer 110C, followed by depositing a patterned bulk polysilicon layer 110A and blanket depositing a sidewall spacer 110B covering the bulk polysilicon layer 110A. The sidewall spacer 110B is then directional etched to remove the horizontal portion thereof, rendering the vertical portion protecting the sidewall of the bulk polysilicon layer 110A. The source 105 and the drain 106 region are formed between the adjacent insulating structures 103 and aligned with the sidewall of the sidewall spacer 110B. In some embodiments, the source 105 and the drain 106 region extends underneath the sidewall spacer 110B if the implantation 604 angle is controlled to be tilted. In at least one embodiment, the source 105 and the drain 106 region contact the channel region. In some embodiments, the source 105 and the drain 106 region are formed in a manner similar to that described with respect to p-well 101B and n-well 101C, but with a different self-aligned mask and with a higher dopant concentration. In some embodiments, the dopant concentration of the source 105 and the drain 106 region can be greater than $1E18/cm^3$.

Figure 6E:
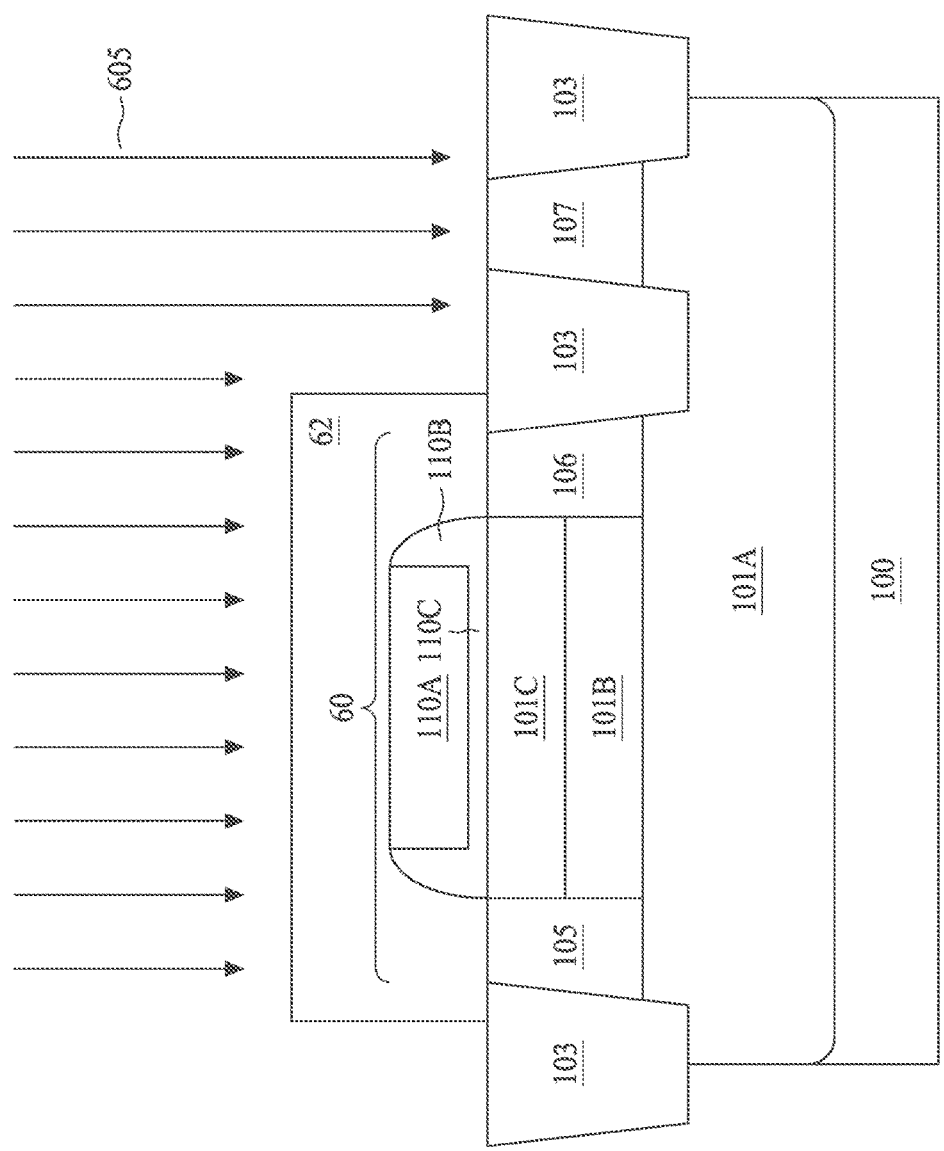

In FIG. 6E, a gate region 107 is formed outside of the self-aligned structure 60 of the PJFET. The gate region 107 is separated from the self-aligned structure 60 by the insulating structure 103. For example, gate region 107 is formed n-doped region having a top surface co-elevational with the front surface 100A of the substrate 100. The gate region 107 contacts the insulating structure 103 and the deep n-well 101A. In some embodiments, the gate region 107 is formed in a manner similar to that described with respect to p-well 101B, n-well 101C, and source and drain regions, but with a different mask made of photoresist 62. The ion implantation 605 is controlled by one or more of energy, dose, and implantation angle to implant the n-type dopant into the substrate 100.

Figure 6F:
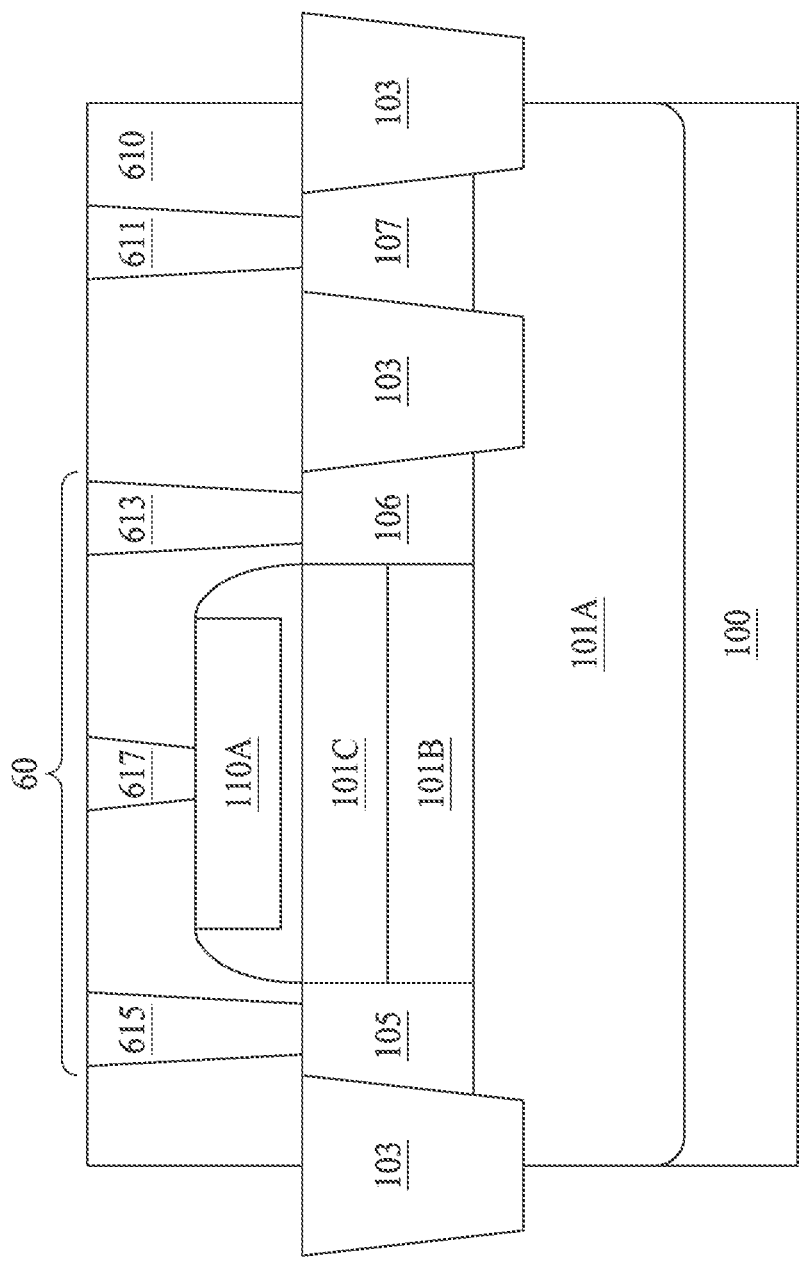

In FIG. 6F, further processes are subsequently performed in some embodiments to connect the PJFET with other circuitry. For example, one or more dielectric layers 610 are deposited over the substrate 100 with the PJFET formed there on, and contact vias 611, 613, 615, 617 are formed in the one or more dielectric layers to be in electric contact with the corresponding gate, drain, source, and polysilicon contact layers (not shown), respectively. In some embodiments, the polysilicon contact 617 is electrically routed in the dielectric layer 610 to connect with the gate contact 611. In other embodiments, the polysilicon contact 617 can be routed with the source contact 615 or the drain contact 613. Still in other embodiments, the polysilicon contact 617 can be floating and subject to external bias independently controlling the n-well 101C and p-well 101B underneath the polysilicon contact 617.

In some embodiments, the JFET structures described herein can be used in an image sensor to alleviate the flicker noise and to retain the limited transistor size constrained by each pixel simultaneously. An image sensor is an apparatus for receiving light, i.e., photons, generated by or reflected from an object, and for generating digital image data. The manufacture of one particular type of image sensor may incorporate conventional complementary metal-oxide-semiconductor (CMOS) fabrication technology. Accordingly, such an image sensor is often referred to as a CMOS image sensor (CIS). Generally, a CMOS image sensor includes a light sensing region for converting photon energy received from an object to an electrical signal (such as current) and a peripheral circuit region for processing and sending the electrical signal to another device for further processing. A photodiode is formed in the light sensing region, and transistors or other devices may be formed in the peripheral circuit region, thereby forming a semiconductor structure. Each pixel in the image sensor may include various transistors such as reset transistors, source follower transistors, selector transistors, and/or transfer transistors. In some embodiments, the JFET structures described herein can be utilized as one of the transistors provided above. Additional circuitry and input/outputs are typically provided adjacent to the array of pixels for providing an operation environment for the pixels and for supporting external communications with the pixels.

Figure 7:
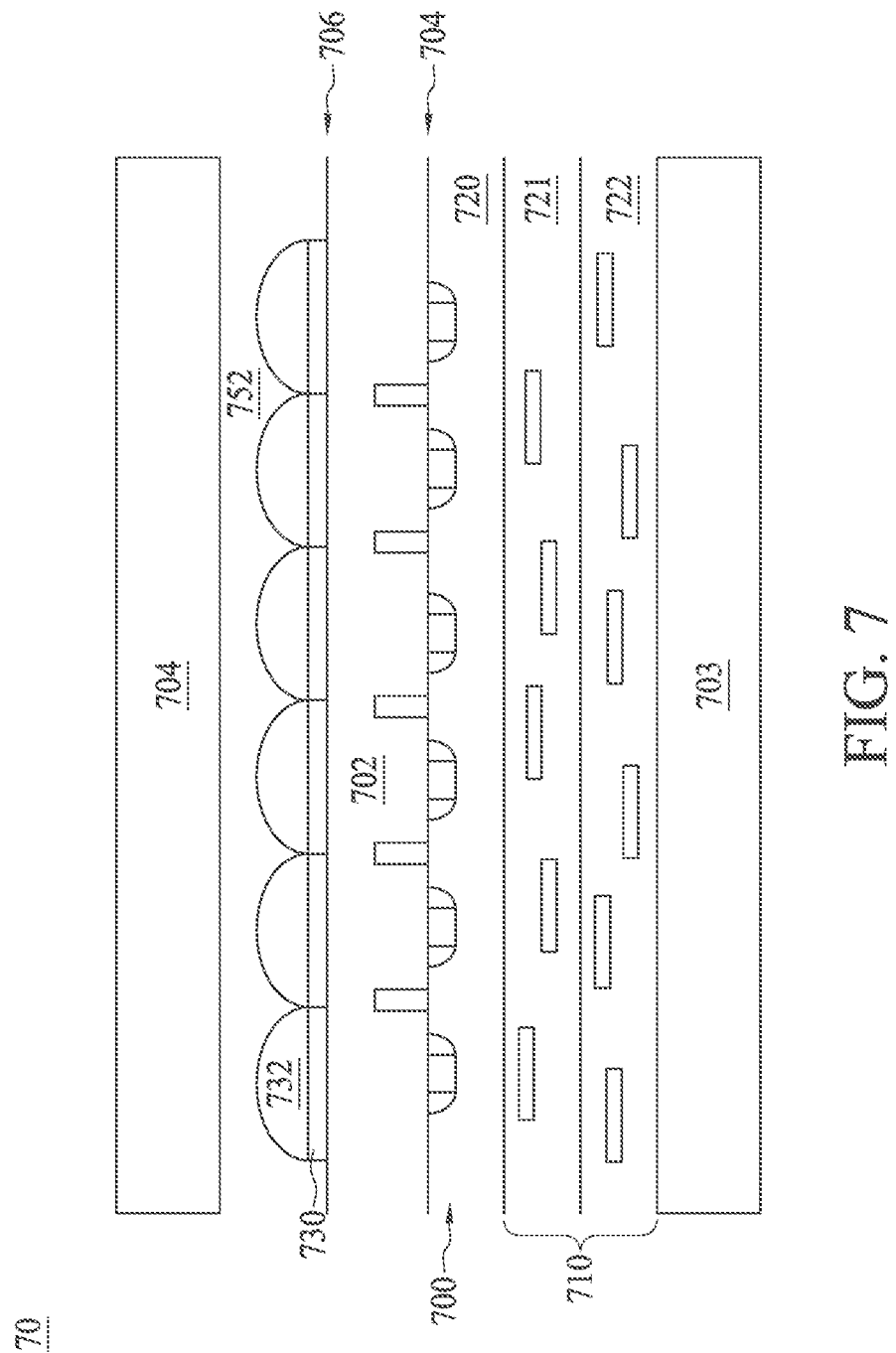
FIG. 7 is a cross sectional view of a backside-illuminating image sensor having the transistor structure described herein, in accordance with some embodiments of the present disclosure.

FIG. 7 show cross sectional views of a backside-illuminating image sensor (BSI) 70 having a JFET structure described herein, in accordance with some embodiments of the present disclosure. The BSI 70 includes a device substrate 702. The device substrate 702 includes a silicon wafer in a crystalline structure. The device substrate 702 may further include an epitaxial (epi) layer grown on a substrate layer. The epi layer may include a dopant of the same type or a different type than the underlying substrate layer. The doping may be accomplished using conventional processes such as ion implantation or diffusion. The device substrate 702 has a frontside 704 and a backside 706. The various microelectronic elements such as the photodetectors and the transistors 700, are formed at the frontside 704 of the device substrate 702. An inter-level dielectric (ILD) 720, such as silicon oxide, is formed over the frontside 704 of the device substrate 702.

The BSI 70 further includes an interconnect structure 710 formed over the ILD 720 at the frontside 704 of the device substrate 702. The interconnect structure 710 includes metal layers and inter-metal dielectric (IMD) 721. The metal layers provide connections between the various microelectronic devices of the BSI device 70. The number of metal layer may vary depending on design requirements. The metal layers are coupled to each other by vias. A topmost metal layer may include metal pads for coupling to bonding pads as discussed below. The IMD 721 may include a low-k material, as compared to a dielectric constant of silicon dioxide. Alternatively, the IMD 721 may include carbon-doped silicon oxide, fluorine-doped silicon oxide, silicon oxide, silicon nitride, and/or organic low-k material. The IMD 721 may be formed by spin-on coating, chemical vapor deposition (CVD), physical vapor deposition (PVD), atomic layer deposition (ALD), or other suitable technique. The material of the metal layers may include aluminum, copper, tungsten, titanium, titanium nitride, tantalum, tantalum nitride, metal silicide or combination thereof. Additionally, the metal layers and IMD may be formed in an integrated process such as a damascene process or lithography/plasma etching process.

The BSI 70 further includes one or more passivation layers 722 to cover and protect the interconnect structure 710 and the device. The passivation layer 722 may be formed of silicon nitride, silicon oxynitride, silicon oxide, combinations thereof, or other suitable materials. The passivation layer 722 may be formed by spin-on coating CVD, PVD, ALD, or other suitable technique. The passivation layer 722 may include openings in which bonding pads are formed on the metal pads of the topmost metal layer of the interconnect structure 710. The bonding pads are configured to provide electrical connection with the interconnect structure 710 for wafer level testing, wiring, or chip packaging. The bonding pads may be formed within the passivation layer 722 by a process known in the art. For example, an etching process may be performed on the passivation layer 722 to open up the metal pad of the topmost metal layer. A conductive material layer may be deposited over the passivation layer 722 filling in the opening. The conductive material layer may then be patterned to form the bonding pads. The bonding pads may include an electrically conductive material such as aluminum, aluminum alloy, copper, copper alloy, or combinations thereof.

As discussed above, the BSI 70 may include pixels that are formed at the frontside 704 of the device substrate 702. Accordingly, the device substrate 702 may be thinned down enough to allow the radiation incident on the backside 706 of the device substrate 702 to reach the pixels. A glass substrate 703 is bonded to the passivation layer 722 at the frontside 704 so that processing the backside 706 of the device substrate 702 may be performed. For example, the device substrate (prior to the thinning) may have a thickness that is about 750 µm. The device substrate 702 may be thinned down from the backside 706 by various techniques such as grinding, etching, CMP, or combinations thereof. After thinning, the device substrate 702 has a thickness ranging from about 1 to about 10 µm. It is understood that the particular thicknesses disclosed herein are mere examples and that other thickness may be implemented depending on the type of application and design requirements of the semiconductor device.

The BSI 70 further includes a color filter layer 730 formed over the backside 706. In the present embodiment, the color filter layer 730 includes filters that can support several different colors (e.g., red, green, and blue), and are positioned such that incident light is directed thereon and therethrough to their respective pixels. The color filter layer 730 may be formed of a polymeric material or resin including color pigments. The BSI 70 further includes a plurality of microlenses 732 in various positional arrangements with the color filter layer 730 and pixels. The microlenses 732 are designed to focus light directed toward the backside 706 of the device substrate 702 to the pixels at the frontside 704. Another glass substrate 704 is coupled to a dam structure (not shown) over the backside 706 thereby forming a cavity 752 that protects and houses the color filter layer 730 and microlenses 732.

However, the BSI 70 described above is not limiting the application of the scale-shrinking JFET structure described herein. Other normally-on devices requiring low flicker noise may implement the scale-shrinking JFET transistor provided in the present disclosure.

Some embodiments of the present disclosure provide a transistor structure, including a self-aligned source-drain structure surrounded by an insulating structure and a gate of a second conductive type separated from the source and the drain by the insulating structure. The self-aligned source-drain structure includes a source and a drain of a first conductive type, a channel between the source and the drain, and a polysilicon contact over and aligned with the channel.

Some embodiments of the present disclosure provide a JFET structure, including a substrate of a first conductive type, the substrate having a front surface and a back surface, a first well of a second conductive type positioned in the substrate, a source and a drain of the first conductive type at the front surface and in connection with the first well, the source and the drain being surrounded by an insulating structure, and a gate of the second conductive type at the front surface and in connection with the first well. The gate is separated from the source and the drain by the insulating structure.

Some embodiments of the present disclosure provide a method for manufacturing a semiconductor package. The method includes providing a substrate having a front surface and a back surface, defining a first well in the substrate, forming an insulating structure configured to surround a self-aligned source-drain structure at the front surface, defining a second well shallower than the first well and surrounded by the insulating structure, and forming the self-aligned source-drain structure. The forming the self-aligned source-drain structure further includes forming a polysilicon contact over the first surface, and forming a source and a drain by using the polysilicon contact as a hard mask.

The foregoing outlines features of several embodiments so that those skilled in the art may better understand the aspects of the present disclosure. Those skilled in the art should appreciate that they may readily use the present disclosure as a basis for designing or modifying other operations and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A transistor structure, comprising
    a self-aligned source-drain structure surrounded by an insulating structure, comprising:
        a source and a drain of a first conductive type;
        a channel between the source and the drain; and
        a polysilicon contact over and aligned with the channel; and
    a gate of a second conductive type separated from the source and the drain by the insulating structure.

2. The transistor structure of claim 1, further comprising:
    a substrate of the second conductive type;
    an isolation layer of the first conductive type embedded in the substrate;
    a first well of the second conductive type over the isolation layer; and
    a second well of the first conductive type in connection with the first well and between the source and the drain.

3. The transistor structure of claim 2, further comprising:
    a third well of the second conductive type in connection with the second well and between the source and the drain, the third well being in contact with the polysilicon contact.

4. The transistor structure of claim 3, wherein the second well is about 500 Angstrom away from the polysilicon contact.

5. The transistor structure of claim 2, wherein a dopant concentration of the isolation layer is greater than a dopant concentration of the second well.

6. The transistor structure of claim 1, further comprising:
a substrate of the first conductive type;
a first well of the second conductive type in the substrate; and
a second well of the first conductive type in connection with the first well and between the source and the drain.

7. The transistor structure of claim 6, wherein the second well is in contact with the polysilicon contact.

8. The transistor structure of claim 1, wherein the polysilicon contact is floating.

9. A JFET structure, comprising:
a substrate of a first conductive type, having a front surface and a back surface;
a first well of a second conductive type positioned in the substrate;
a source and a drain of the first conductive type at the front surface and in contact with the first well, the source and the drain being surrounded by an insulating structure; and
a gate of the second conductive type at the front surface and in connection with the first well,
wherein the gate is separated from the source and the drain by the insulating structure.

10. A JFET structure, comprising:
a substrate of a first conductive type, having a front surface and a back surface;
a first well of a second conductive type positioned in the substrate;
a source and a drain of the first conductive type at the front surface and in connection with the first well, the source and the drain being surrounded by an insulating structure;
a gate of the second conductive type at the front surface and in connection with the first well, wherein the gate is separated from the source and the drain by the insulating structure, and
a polysilicon contact over the front surface and aligned with a side edge of the source and a side edge of the drain.

11. The JFET structure of claim 10, further comprising:
a second well of the first conductive type in connection with the first well and between the source and the drain.

12. The JFET structure of claim 11, further comprising:
a third well of the second conductive type in connection with the second well and between the source and the drain, the third well being in contact with the polysilicon contact.

13. The JFET structure of claim 12, an interface of the second well and the third well is substantially at a level of one half depth of the source.

14. The JFET structure of claim 12, wherein a dopant concentration of the second well and a dopant concentration of the third well are substantially identical.

15. The JFET structure of claim 14, wherein the dopant concentration of the second well is from about $1E16/cm^3$ to about $1E18/cm^3$.

16. The JFET structure of claim 10, wherein the polysilicon contact is electrically connected to the gate.

17. A transistor structure, comprising
a substrate having a front surface;
a source and a drain of a first conductive type extending into the substrate from the front surface, aligning out a projection area of a polysilicon contact over the front surface;
a first well of a second conductive type under the source and the drain;
a second well of the first conductive type between the source and the drain and away from the front surface.

18. The transistor structure of claim 17, further comprising a third well of a second conductive type between the source and the drain and in contact with the front surface.

19. The transistor structure of claim 18, further comprising:
an insulating structure surrounding the second well, the third well, the source, and the drain; and
a gate of the second conductive type separated from the second well, the third well, the source, and the drain by the insulating structure and under the front surface.

20. The transistor structure of claim 18, wherein an interface of the second well and the third well is substantially at a level of one half depth of the source.

* * * * *